(12) United States Patent
Mohler

(10) Patent No.: US 7,896,988 B2
(45) Date of Patent: Mar. 1, 2011

(54) CHARGE SYSTEM FOR DESTROYING CHIPS ON A CIRCUIT BOARD AND METHOD FOR DESTROYING CHIPS ON A CIRCUIT BOARD

(75) Inventor: Jonathan Mohler, West Palm Beach, FL (US)

(73) Assignee: Spectre Enterprises, Inc., West Palm Beach, FL (US)

( * ) Notice: Subject to any disclaimer, the term of this patent is extended or adjusted under 35 U.S.C. 154(b) by 694 days.

(21) Appl. No.: 11/763,529

(22) Filed: Jun. 15, 2007

(65) Prior Publication Data

US 2008/0307992 A1 Dec. 18, 2008

(51) Int. Cl.
*C06B 45/00* (2006.01)
*C06B 45/12* (2006.01)
*C06B 45/14* (2006.01)
*C06B 33/00* (2006.01)
*D03D 23/00* (2006.01)
*D03D 43/00* (2006.01)

(52) U.S. Cl. ............... 149/14; 149/2; 149/15; 149/37; 149/108.2; 149/109.4

(58) Field of Classification Search ............ 149/14, 149/2, 15, 37, 108.2, 109.4
See application file for complete search history.

(56) References Cited

U.S. PATENT DOCUMENTS

| 3,697,668 | A | | 10/1972 | Campbell |
|---|---|---|---|---|
| 4,464,989 | A | | 8/1984 | Gibson et al. |
| 4,963,203 | A | | 10/1990 | Halcomb et al. |
| 4,996,922 | A | * | 3/1991 | Halcomb et al. ............ 102/205 |
| 5,042,386 | A | * | 8/1991 | Kruse et al. .................. 102/293 |
| 6,183,569 | B1 | | 2/2001 | Mohler |
| 6,805,832 | B2 | | 10/2004 | Mohler |
| 2005/0215053 | A1 | | 9/2005 | Soininen et al. |

OTHER PUBLICATIONS

International Searching Authority (ISA/US), "Notification of Transmittal of the International Search Report and the Written Opinion of the International Searching Authority, or the Declaration", Sep. 17, 2008, 9 pp.

\* cited by examiner

*Primary Examiner*—Jerry Lorengo
*Assistant Examiner*—James E McDonough
(74) *Attorney, Agent, or Firm*—Eckert Seamans Cherin & Mellott, LLC; Kirk D. Houser, Esquire

(57) ABSTRACT

A charge system for destroying chips on a circuit board is provided. The charge system has a first substrate having a number of recesses formed therein with each of the recesses having a housing disposed therein. A high density charge is disposed within the housing. A number of recesses are formed within the high density charge. A number of low density charges are disposed within each of the recesses formed within the high density charge. A second substrate is located proximate to the first substrate. The low density charge and the high density charge are structured to destroy the second substrate after ignition. A method of destroying chips is also provided.

2 Claims, 3 Drawing Sheets

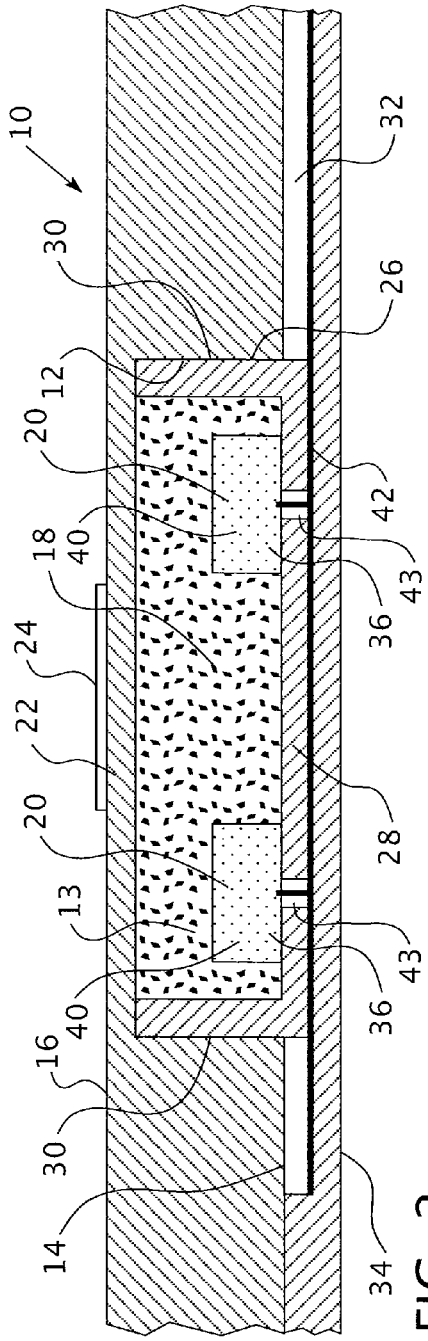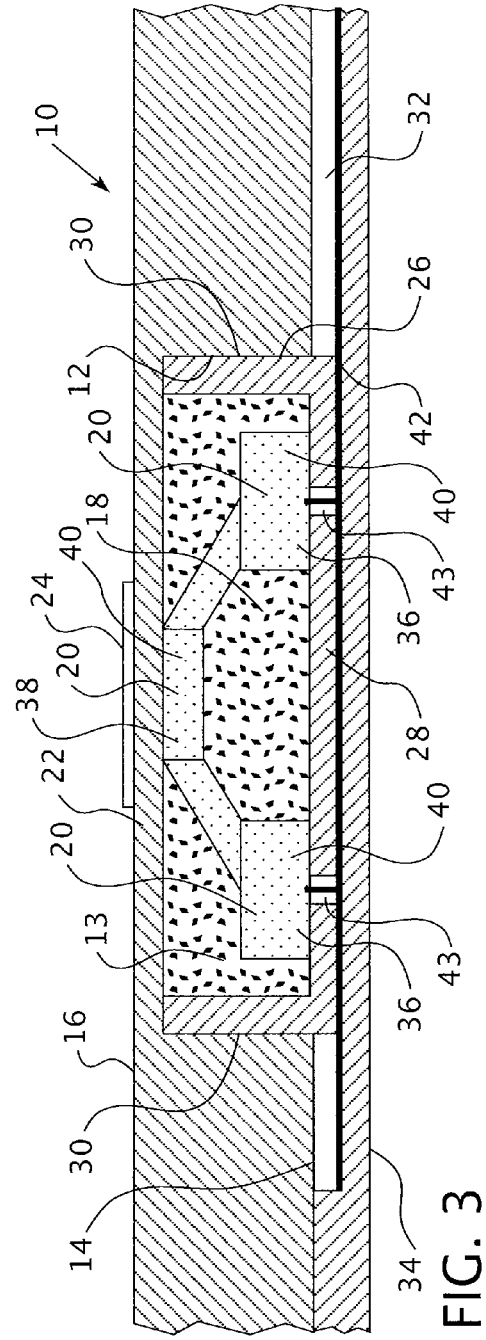

CHARGE SYSTEM FOR DESTROYING CHIPS ON A CIRCUIT BOARD AND METHOD FOR DESTROYING CHIPS ON A CIRCUIT BOARD

FIELD OF THE INVENTION

The invention generally relates to a charge system for destroying chips on a circuit board and a method for destroying chips on a circuit board.

BACKGROUND OF THE INVENTION

Electronic devices may contain circuitry that includes information in the form of data or engineering features that must be protected from theft by direct reading or by reverse engineering. One anti-tamper system known in the art employs the use of small torches for penetrating integrated circuit ("IC") packages to destroy the chip that contains sensitive circuitry. The torches are located between the IC and the adjacent circuit board or the housing in the space between the IC and adjacent circuit board or the housing.

In newer electronic devices, unpackaged IC chips are arrayed on thermally conductive circuit board panels. These IC chips are relatively thin and may be, on the order of 0.010 inch to 0.012 inch (0.025 cm to 0.030 cm), and are most often made from either a silicon or gallium arsenide substrate. These IC arrays are contained under a closely spaced housing or, in some instances, in direct contact with the housing material. Due to the tight quarters, no space is left for mounting torches between the IC and the housing as is the practice in the prior art.

As a result, a need exists in the art for a charge system for destroying chips on a circuit board that does not take up additional space within the housing.

An additional need exists in the art for a method for destroying chips on a circuit board that does not take up additional space within the housing.

SUMMARY OF THE INVENTION

An object of the invention is to provide a charge system that does not take up additional space within the housing for destroying chips on a circuit board.

Another object of the invention is to provide a method for destroying chips on a circuit board that does not take up additional space within the housing.

Certain objects of the invention are achieved by providing a charge system for destroying a substrate. The charge system has a first substrate having a number of recesses formed therein with each of the recesses having a housing disposed therein. A high density charge is disposed within the housing. A number of recesses are formed within the high density charge. A number of low density charges are disposed within each of the recesses formed within the high density charge. A second substrate is located proximate to the first substrate. A boundary is formed in the first substrate which is located between the high density charge and the second substrate. The housing has a bottom with a number of apertures formed therein that are structured to receive an energy supply for contact with the low density charge. The low density charge is structured to be ignited with the energy supply. The high density charge is structured to be ignited from the low density charge after the low density charge has been ignited. The low density charge and the high density charge are structured to destroy the second substrate after ignition.

Other objects of the invention are achieved by providing a charge system for destroying a substrate. The charge system has a first substrate having a number of recesses formed therein with each of the recesses having a housing disposed therein. A high density charge is disposed within the housing. A number of recesses are formed within the high density charge. A number of low density charges are disposed within each of the recesses formed within the high density charge. A second substrate is located proximate to the first substrate. The housing has a bottom with a number of apertures formed therein that are structured to receive an energy supply for contact with the low density charge. The low density charge is structured to be ignited with the energy supply. The high density charge is structured to be ignited from the low density charge after the low density charge has been ignited. The high density charge is structured to form an alloy with the second substrate after the high density charge has been ignited. The low density charge and the high density charge are structured to destroy the second substrate after ignition.

Other objects of the invention are achieved by providing a method of destroying a substrate with a charge system of the type described above comprising: igniting the low density charge; igniting the high density charge; and destroying the second substrate located proximate to the first substrate.

These and other objects of the invention will be readily apparent from the following description and claims.

BRIEF DESCRIPTION OF THE DRAWINGS

FIG. 2 is a cross-sectional view of a circuit board containing an imbedded charge system for destroying chips on a circuit board in accordance with an embodiment of the invention;

FIG. 3 is a cross-sectional view of a circuit board containing an imbedded charge system for destroying chips on a circuit board in accordance with another embodiment of the invention.

DESCRIPTION OF THE PREFERRED EMBODIMENTS

Figure 1:
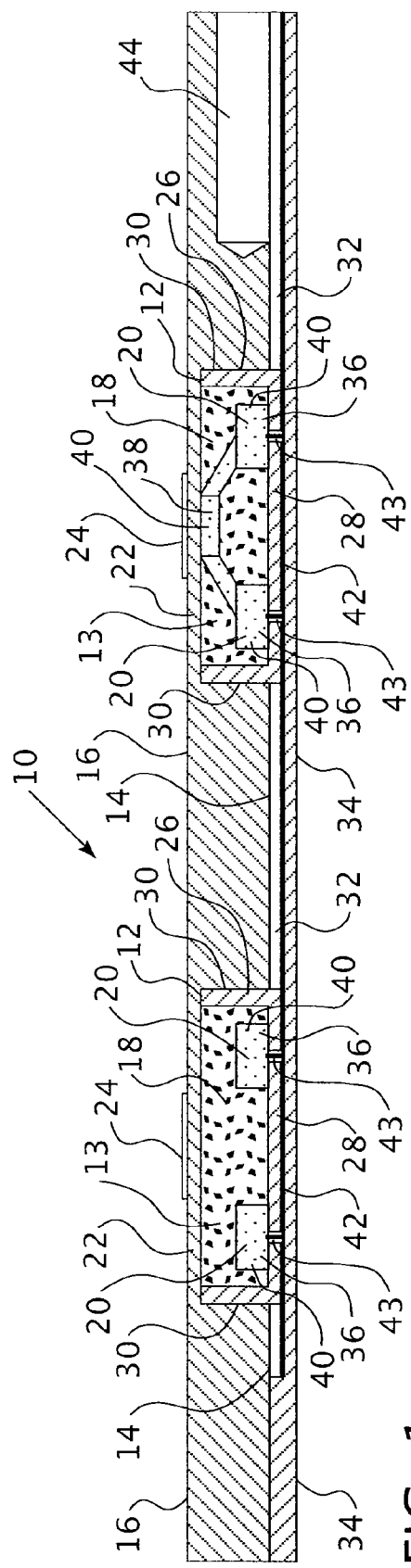
FIG. 1 is a cross-sectional view of a circuit board containing imbedded charge systems for destroying chips on a circuit board in accordance with the invention.

For purposes of the description hereinafter, the terms "upper", "lower", "vertical", "horizontal", "axial", "top", "bottom", "aft", "behind", and derivatives thereof shall relate to the invention as it is oriented in the drawing FIGS. or as it is oriented when it is coupled to an electronic device that is resting upright on a flat and level horizontal surface. However, it is to be understood that the invention may assume various alternative configurations when the invention is moved about or the electronic device, for example, is attached in an airplane in a non-upright position. It is also to be understood that the specific elements illustrated in the FIGS. and described in the following specification are simply exemplary embodiments of the invention. Therefore, specific dimensions, orientations and other physical characteristics related to the embodiments disclosed herein are not to be considered limiting.

As employed herein, the term "number" shall mean one or an integer greater than one (i.e., a plurality). As employed herein, the statement that two or more parts are "attached", "connected", "coupled", or "engaged" together shall mean that the parts are joined together either directly or joined through one or more intermediate parts. As used herein, the term "charge" means an intermetallic charge or a metal/oxide charge. As used herein, the term "intermetallic" means composed of two or more metals or of a metal and a nonmetal.

FIG. 1 shows a first substrate 10 having a number of recesses 12 formed therein. The first substrate 10 is typically a circuit board. Each of the recesses 12 contains an internal charge system 13.

With reference to FIGS. 2-3, the first substrate 10 has a first surface 14 and a second surface 16. A number of recesses 12 are formed within the first surface 14 of the first substrate 10. The recesses 12 contain high density charges 18. The high density charges 18 have a number of recesses 20 formed therein. The second surface 16 of the first substrate 10 forms an optional boundary 22 proximate to the high density charges 18 and recesses 12 that contain the high density charges 18. The optional boundary 22 may have a thickness from about 0.000 inch (0.000 cm) to about 0.030 inch (0.076 cm). A second substrate 24 is coupled to the second surface 16 and is located proximate to the second surface 16 and the high density charges 18. The second substrate 24 is typically a chip. The optional boundary 22 is formed in the first substrate 10 and is located between the high density charges 18 and the second substrate 24. Each of the high density charges 18 are enclosed within its respective recess 12 by a housing 26 which is in the configuration of a cup member as shown in FIGS. 1-3. The housing 26 has a bottom 28 with a cylindrical wall portion 30 coupled thereto. The housing 26 may be made of an insulating material such as a thermally insulating material or an electrically insulating material. A channel or passageway 32 is located proximate to the first surface 14 of the first substrate 10 and is enclosed by a third substrate 34. The channel or passageway 32 is defined between the first substrate 10 and the third substrate 34. The third substrate 34 is typically adhered to the first substrate 10 with an effective amount of adhesive, glue or the like. Alternatively, the third substrate 34 may be an integral component or integrally connected to the first substrate 10. The third substrate 34 may be a panel or a plate to which the first substrate 10 is attached. The bottom 28 of the cup member 26 is located within or proximate to the channel or passageway 32.

With reference to FIG. 2, the recesses 20 disposed within the high density charges 18 may be located at a first location 36 proximate to the first surface 14 of the first substrate 10. The internal charge system 13 of FIG. 2 uses thermal conductivity to transfer energy to the second substrate 24.

Alternatively, with reference to FIG. 3, the recesses 20 disposed within the high density charges 18 may be located at a first location 36 proximate to the first surface 14 of the first substrate 10 or a second location 38 proximate to the second surface 16 of the first substrate 10. The second location 38 is located above the first location 36. Such recesses 20 may have a general cylindrical shaped configuration. The second location 38 is integrally connected to the first location 36 and may be attached together with a general cylindrical shaped passageway configuration. The second location 38 is located proximate to the boundary 22 and the second substrate 24. The internal charge system 13 of FIG. 3 uses the recesses 20 to supply the initially ignited reaction products located within the recesses 20 to the second location 38 proximate to the optional boundary 22 and the second substrate 24. Such an arrangement could initiate a torch like action that penetrates the optional boundary 22 and generates an enlarged opening in the first substrate 10 when the optional boundary 22 is provided in the first substrate 10. The internal charge system 13 of FIG. 3 uses a kinetic energy flow mechanism to transfer energy to the second substrate 24.

The high density charges 18 are insulated by the cup member 26 except at the optional boundary 22. Such insulation allows the high density charges 18 to direct the energy of the high density charges 18 toward the second substrate 24 when the high density charges 18 are ignited. The cup member 26 is insulated on the bottom 28 and on the cylindrical wall portion 30 coupled thereto.

The recesses 20 in the high density charges 18 may be cylindrical and contain low density charges 40. The low density charges 40 are structured to be reliably ignited by supplying energy to the channel or passageway 32 from a wire or fuse 42 that is located within the channel or passageway 32 proximate to and beneath cup member 26 and the high density charges 18. The bottom 28 of the housing 26 has a number of apertures 43 formed therein that are structured to receive an energy supply. The energy supply may be delivered by the wire or fuse 42. The wire or fuse 42 delivers the energy supply to the low density charges 40.

Figure 4:
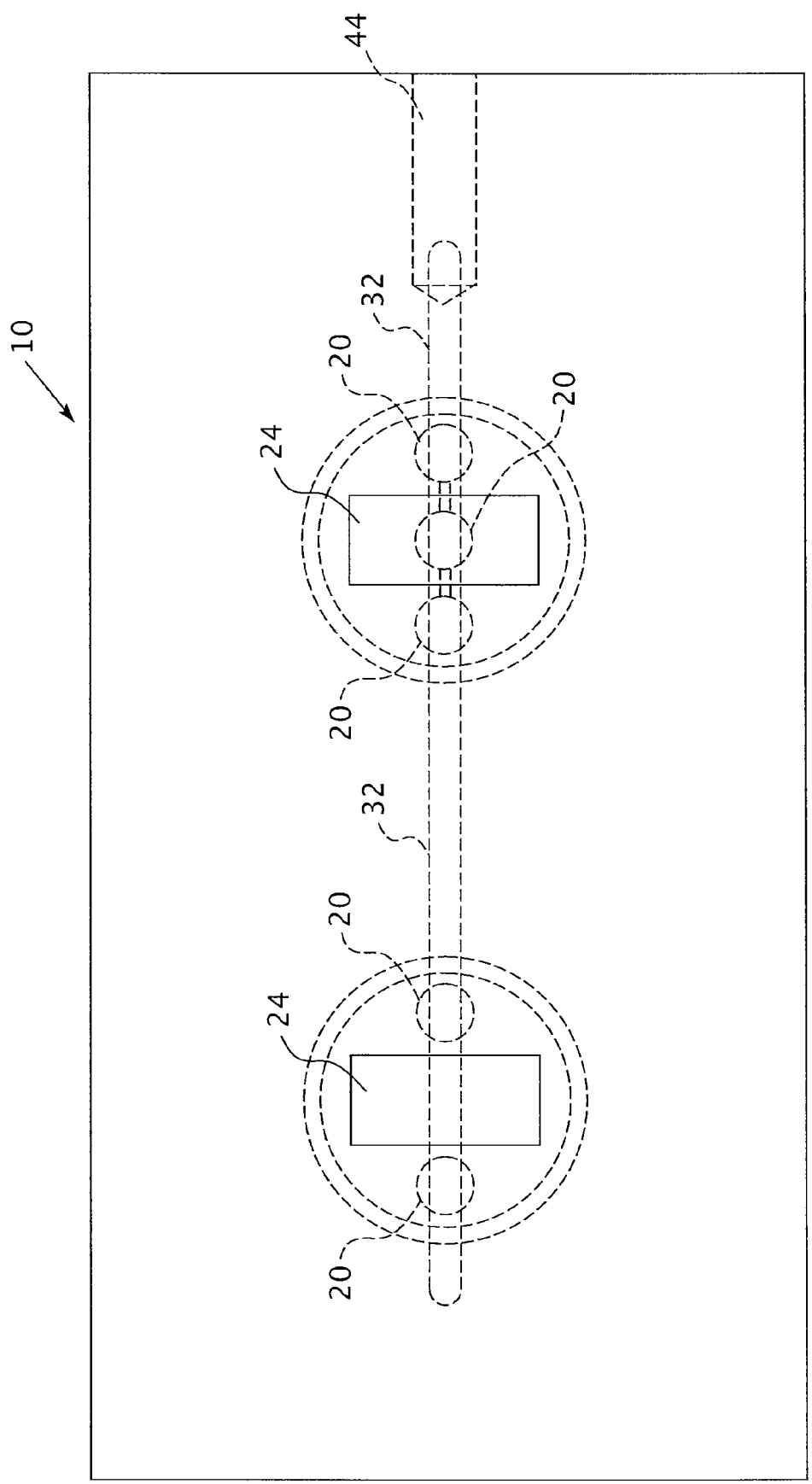
FIG. 4 is a top plan view of a circuit board containing imbedded charge systems for destroying chips on a circuit board in accordance with the invention

With reference to FIG. 4, an igniter 44 such as, for example, an electric match may be provided at an edge of the first substrate 10 at an end of the channel or passageway 32. The igniter 44 is structured to supply energy to the wire or fuse 42 received within the channel or passageway 32 in order to ignite the low density charge 40. The high density charges 18 are structured to be ignited from the low density charges 40 that have been ignited. Upon ignition of the low density charges 40 and the high density charges 18, the energy is directed toward an open end of the housing 26 which penetrates the optional boundary 22 when the optional boundary 22 is provided in the first substrate 10. Then, the second substrate 24 is destroyed. When the optional boundary 22 is not provided in the first substrate 10 (e.g., the boundary 22 has a thickness of 0.000 inch (0.000 cm)), the second substrate 24 is destroyed upon ignition of the low density charges 40 and the high density charges 18. The igniter 44 is typically activated upon detecting tampering with the second substrate 24.

The high density charges 18 and/or the low density charges 40 may be of any of a number of low gas producing compositions such as, for example, $Al/CuO$, $Al/Cu_2O$, $Al/CuO/Cu_2O$, $Al/CoO$, $Al/Co_3O_4$, $Al/MnO_2$, $Al/NiO$, $Al/Ni_2O_3$, $Al/PbO_2$, $Al/PdO$, $Al/WO_3$, $Al/Fe_2O_3$, $B/Ti$, $Al/B/Ti$ and $Al/V_2O_5$. Each of the symbols mentioned above are representative of the element provided in the periodic table of elements.

For example, the B/Ti high density charges 18 and/or the low density charges 40 may comprise from about 30 to about 32 weight percent boron with the balance being essentially titanium and typical impurities. The Al/B/Ti high density charges 18 and/or the low density charges 40 may comprise from about 11 to about 27 weight percent aluminum, from about 15 to about 25 weight percent boron with the balance being essentially titanium and typical impurities. The $Al/Fe_2O_3$ high density charges 18 and/or the low density charges 40 may comprise from about 22 to about 30 weight percent aluminum with the balance being essentially $Fe_2O_3$ and typical impurities. The $Al/CuO/Cu_2O$ high density charges 18 and/or the low density charges 40 may comprise from about 11 to about 18 weight percent aluminum with the balance being essentially $CuO/Cu_2O$ and typical impurities. The Al/PdO high density charges 18 and/or the low density charges 40 may comprise from about 12 to about 17 weight percent aluminum with the balance being PdO and typical impurities. The $Al/WO_3$ high density charges 18 and/or the low density charges 40 may comprise from about 18 to about 25 weight percent aluminum with the balance being $WO_3$ and typical impurities. The $Al/V_2O_5$ high density charges 18 and/ or low density charges 40 may comprise from about 30 to about 45 weight percent aluminum with the balance being $V_2O_5$ and typical impurities.

When $Al/V_2O_5$ high density charges 18 and/or low density charges 40 are used, the boundary 22 will be relatively thin or not provided in the first substrate 10. When the optional boundary 22 is not provided, the high density charges 18 are coupled to the second substrate 24. When $Al/V_2O_5$ high density charges 18 are ignited, the high density charges 18 are converted into vanadium and alumina oxide. The vanadium is structured to form an alloy with the silicon provided in the second substrate 24 after the high density charges 18 have been ignited. The second substrate 24 is destroyed by the resultant exothermic reaction after the high density charges 18 and/or the low density charges 40 are ignited. There may be other high density charges 18 that are structured to form an alloy with the silicon provided in the second substrate 24 after the high density charges 18 have been ignited in addition to the disclosed $Al/V_2O_5$ high density charges 18 example. Also, there may be other materials that could be provided in the second substrate 24 that are structured to form an alloy with the high density charges 18 after the high density charges 18 have been ignited in addition to the disclosed silicon material example. Accordingly, the $Al/V_2O_5$ high density charge 18 example and the silicon material provided in the second substrate 24 example are not considered express limitations of the invention.

The high density charges 18 are pressed to high density. As used herein, "high density" means that the high density charges 18 are pressed to over seventy percent of its theoretical maximum density. There are several benefits to using high density charges 18 such as, for example, high energy concentration, high thermal conductivity, reduced burn rate and high mechanical strength. Thermal conductivity of the high density charges 18 is also desirable for the conductive cooling of the second substrate 24. The high density charges 18 that could be used for the conductive cooling of the second substrate 24 are likely to be B/Ti, Al/B/Ti, $Al/Fe_2O_3$, $Al/CuO/Cu_2O$ Al/PdO, $Al/V_2O_5$ and $Al/WO_3$.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended hereto and any and all equivalents thereof.

What is claimed is:

1. A charge system for destroying a substrate comprising:
    a first substrate having a number of recesses formed therein with each of the recesses having a housing disposed therein;
    a high density charge disposed within the housing with a number of recesses formed within the high density charge;
    a number of low density charges disposed within each of the recesses formed within the high density charge;
    a second substrate located proximate to the first substrate; and
    a boundary formed in the first substrate located between the high density charge and the second substrate,
    wherein the housing has a bottom with a number of apertures formed therein that are structured to receive an energy supply for contact with the low density charge,
    wherein the low density charge is structured to be ignited with the energy supply,
    wherein the high density charge is structured to be ignited from the low density charge after the low density charge has been ignited,
    wherein the low density charge and the high density charge are structured to destroy the second substrate after ignition, and
    wherein the first substrate is a circuit board and the second substrate is a chip.

2. A charge system for destroying a substrate comprising:
    a first substrate having a number of recesses formed therein with each of the recesses having a housing disposed therein;
    a high density charge disposed within the housing with a number of recesses formed within the high density charge;
    a number of low density charges disposed within each of the recesses formed within the high density charge; and
    a second substrate located proximate to the first substrate,
    wherein the high density charge is directly coupled to the second substrate,
    wherein the housing has a bottom with a number of apertures formed therein that are structured to receive an energy supply for contact with the low density charge,
    wherein the low density charge is structured to be ignited with the energy supply,
    wherein the high density charge is structured to be ignited from the low density charge after the low density charge has been ignited,
    wherein the high density charge is structured to form an alloy with the second substrate after the high density charge has been ignited,
    wherein the low density charge and the high density charge are structured to destroy the second substrate after ignition, and
    wherein the first substrate is a circuit board and the second substrate is a chip.

* * * * *